United States Patent
Ozawa et al.

(10) Patent No.: US 10,626,205 B2
(45) Date of Patent: Apr. 21, 2020

(54) METHOD FOR PRODUCING COPOLYMER

(71) Applicant: ZEON CORPORATION, Chiyoda-ku, Tokyo (JP)

(72) Inventors: Kakuei Ozawa, Tokyo (JP); Nobunori Abe, Tokyo (JP)

(73) Assignee: ZEON CORPORATION, Chiyoda-ku, Tokyo (JP)

( * ) Notice: Subject to any disclaimer, the term of this patent is extended or adjusted under 35 U.S.C. 154(b) by 111 days.

(21) Appl. No.: 16/081,535

(22) PCT Filed: Mar. 3, 2017

(86) PCT No.: PCT/JP2017/008597
§ 371 (c)(1),
(2) Date: Aug. 31, 2018

(87) PCT Pub. No.: WO2017/163825
PCT Pub. Date: Sep. 28, 2017

(65) Prior Publication Data
US 2019/0248940 A1    Aug. 15, 2019

(30) Foreign Application Priority Data

Mar. 25, 2016  (JP) .................. 2016-061742

(51) Int. Cl.
| | | |
|---|---|---|
| C08F 220/22 | (2006.01) | |
| G03F 7/039 | (2006.01) | |
| C08F 212/06 | (2006.01) | |
| G03F 7/20 | (2006.01) | |
| C08F 212/12 | (2006.01) | |

(52) U.S. Cl.
CPC .......... *C08F 220/22* (2013.01); *C08F 212/06* (2013.01); *C08F 212/12* (2013.01); *G03F 7/039* (2013.01); *G03F 7/20* (2013.01); *C08F 2800/10* (2013.01)

(58) Field of Classification Search
CPC .... C08F 220/22; C08F 212/06; C08F 212/12; C08F 2800/10; G03F 7/039; G03F 7/20
USPC ....................................... 526/208
See application file for complete search history.

(56) References Cited

FOREIGN PATENT DOCUMENTS

| JP | H083636 B2 | 1/1996 |
|---|---|---|
| JP | 2016012104 A | 1/2016 |

OTHER PUBLICATIONS

Sep. 25, 2018, International Preliminary Report on Patentability issued in the International Patent Application No. PCT/JP2017/008597.
Nov. 18, 2019, the Extended European Search Report issued by the European Patent Office in the corresponding European Patent Application No. 17769870.1.

*Primary Examiner* — William K Cheung
(74) *Attorney, Agent, or Firm* — Kenja IP Law PC

(57) ABSTRACT

The present disclosure provides a method for efficiently producing an α-alkylstyrene α-chloroacrylate copolymer having a high monomer conversion rate. According to the present disclosure, the method for producing a copolymer containing 30 mol % to 70 mol % of an α-alkylstyrene unit and 30 mol % to 70 mol % of an α-chloroacrylate unit includes a step of performing solution polymerization of a monomer composition containing α-alkylstyrene and α-chloroacrylate, and uses ketone as a polymerization solvent for the solution polymerization.

9 Claims, No Drawings

METHOD FOR PRODUCING COPOLYMER

This application is a U.S. national stage application under 35 U.S.C. § 371 of Application No. PCT/JP2017/008597, filed on Mar. 3, 2017, which claims the priority benefit of Japan Patent Application No. 2016-061742 filed on Mar. 25, 2016, the contents of which are incorporated herein in their entirety by reference.

TECHNICAL FIELD

The present disclosure relates to a method for producing a copolymer and, in particular, to a method for producing a copolymer by solution polymerization.

BACKGROUND

Conventionally, in the field of semiconductor fabrication and so on, a polymer having enhanced solubility to a developing solution due to its main chain cut by irradiation of ionizing radiation such as electron beams or short wavelength light such as ultraviolet rays (hereinafter, the ionizing radiation and the short wavelength light may be collectively referred to as "ionizing radiation") is used as positive resist of a main chain scission type.

For example, PTL 1 set forth below discloses, as positive resist of the main chain scission type having high sensitivity, positive resist formed of α-alkylstyrene α-chloroacrylate copolymer containing 30 mol % to 70 mol % of an α-methylstyrene unit and 30 mol % to 70 mol % of a methyl α-chloroacrylate unit.

Also, for example, PTL 2 set forth below discloses an α-alkylstyrene α-chloroacrylate copolymer, usable as positive resist having high resolution, having weight-average molecular weight of 9500 to 35000 and molecular weight distribution (weight-average molecular weight/number-average molecular weight) of 1.05 to 1.25. The PTL 2 prepares the α-alkylstyrene α-chloroacrylate copolymer having the above property by solution polymerization using dioxane as a polymerization solvent.

CITATION LIST

Patent Literature

PTL 1: JP-B-08-3636
PTL 2: JP-A-2016-12104

SUMMARY

Technical Problem

However, there remains room for improvements to the conventional method for producing the α-alkylstyrene α-chloroacrylate copolymer by using dioxane as a polymerization solvent, in terms of a low monomer conversion rate.

The present disclosure aims to provide a method for efficiently producing an α-alkylstyrene α-chloroacrylate copolymer having high monomer conversion rate.

Solution to Problem

The present inventors diligently studied to achieve the above object. As a result of studies on various polymerization conditions for preparing the α-alkylstyrene α-chloroacrylate copolymer by solution polymerization, the present inventors completed the present disclosure by finding that use of ketone as the polymerization solvent improves a monomer conversion rate and thus enables efficient production of the α-alkylstyrene α-chloroacrylate copolymer.

That is, in order to solve the above problem in an advantageous manner, the present disclosure provides a method for producing a copolymer containing 30 mol % to 70 mol % of an α-alkylstyrene unit and 30 mol % to 70 mol % of an α-chloroacrylate unit. This method includes a process for performing solution polymerization of a monomer composition containing α-alkylstyrene and α-chloroacrylate by using ketone as a polymerization solvent. As described above, the use of ketone as the polymerization solvent in preparation of a copolymer containing 30 mol % to 70 mol % of the α-alkylstyrene unit and 30 mol % to 70 mol % of the α-chloroacrylate unit by solution polymerization of a monomer composition containing α-alkylstyrene and α-chloroacrylate improves the monomer conversion rate and enables efficient production of the copolymer.

According to the present disclosure, the content of each monomer unit may be measured by using a nuclear magnetic resonance (NMR) method.

Here, in the method for producing the copolymer according the present disclosure, cyclic ketone is preferably used as the polymerization solution. The use of cyclic ketone as the polymerization solution further improves the monomer conversion rate and enables further efficient production of the copolymer.

In the method for producing the copolymer according to the present disclosure, cyclopentanone or cyclohexanone is preferably used as the polymerization solvent. The use of cyclopentanone or cyclohexanone as the polymerization solvent further improves the monomer conversion rate and enables further efficient production of the copolymer. Also, cyclopentanone and cyclohexanone have relatively low toxicity to the human body and thus are excellent in terms of safety.

In the method for producing the copolymer according to the present disclosure, α-alkylstyrene is preferably alfa-methyl styrene, and α-chloroacrylate is preferably methyl α-chloroacrylate. A copolymer containing an alfa-methylstyrene unit and a methyl α-chloroacrylate unit can be favorably used as positive resist.

In the method for producing the copolymer according to the present disclosure, a total content of the α-alkylstyrene unit and the α-chloroacrylate unit in the copolymer accounts for 100 mol %. A copolymer containing only the α-alkylstyrene unit and the α-chloroacrylate unit may be favorably used as positive resist. Also, when only α-alkylstyrene and α-chloroacrylate are used as monomers and, simultaneously, ketone is used as a polymerization solvent, the monomer conversion rate is particularly likely to improve.

In the method for producing the copolymer according to the present disclosure, a weight-average molecular weight of the copolymer is preferably 30000 to 100000. The copolymer with the weight-average molecular weight of 30000 to 100000 may be favorably used as positive resist. Also, when the copolymer with the weight-average molecular weight of 30000 to 100000 is prepared by using ketone as a polymerization solvent, the monomer conversion rate is particularly likely to improve.

In the method for producing the copolymer according to the present disclosure, a weight-average molecular weight of the copolymer is preferably 50000 to 70000. The copolymer with the weight-average molecular weight of 50000 to 70000 may be particularly favorably used as positive resist. Also, when the copolymer with the weight-average molecular weight of 50000 to 70000 is prepared by using ketone as a polymerization solvent, the monomer conversion rate is further likely to improve.

In the method for producing the copolymer according to the present disclosure, the copolymer preferably has a molecular weight distribution (the weight-average molecular weight/the number-average molecular weight) of 1.3 to 2.5. The copolymer with the molecular weight distribution of 1.3 to 2.5 can be favorably used as positive resist. Also, when a copolymer with the molecular weight distribution of 1.3 to 2.5 is prepared by using ketone as a polymerization solvent, the monomer conversion rate is particularly likely to improve.

According to the present disclosure, the weight-average molecular weight and the number-average molecular weight mentioned above may be measured as a value in terms of standard polystyrene by employing gel permeation chromatography.

In the method for producing a copolymer according to the present disclosure, the solution polymerization is preferably performed by using azobisisobutyronitrile as a polymerization initiator. When azobisisobutyronitrile is used as a polymerization initiator for solution polymerization of a predetermined α-alkylstyrene α-chloroacrylate copolymer by using ketone as a polymerization solvent, the monomer conversion rate further improves, and the copolymer may be further efficiently produced.

Advantageous Effect

The method for producing a copolymer according to the present disclosure is capable of improving the monomer conversion rate and efficiently producing the α-alkylstyrene α-chloroacrylate copolymer.

DETAILED DESCRIPTION

Hereinafter, an embodiment of the present disclosure will be described in detail. Here, a copolymer produced by a method according to the present disclosure can be favorably used as positive resist of a main chain scission type having a low molecular weight due to its main chain cut by ionizing radiation such as electron beams or irradiation of short-wavelength light such as ultraviolet rays. A positive resist composition containing the copolymer produced by the method according to the present disclosure as positive resist may be used to form a fine resist pattern in a manufacturing process of, for example, semiconductor devices, photomasks, and master templates of nanoimprint.

A method for producing a copolymer according to the present disclosure is a method for producing a copolymer containing 30 mol % to 70 mol % of an α-alkylstyrene unit and 30 mol % to 70 mol % of an α-chloroacrylate unit. The method for producing a copolymer according to the present disclosure includes a process (a polymerization process) for performing solution polymerization of a monomer composition containing α-alkylstyrene and α-chloroacrylate. The method optionally includes a process (a recovery process) for recovering the copolymer by removing the polymerization solvent and unreacted monomers (residual monomers) from a polymer solution resulting from the polymerization. The method for producing the copolymer according to the present disclosure needs to use ketone as a polymerization solvent for the solution polymerization in the process. In production of the predetermined copolymer described above by performing solution polymerization of a monomer composition containing α-alkylstyrene and α-chloroacrylate, using ketone as a solvent somehow improves a monomer conversion rate and enables efficient production of the copolymer.

Note that the copolymer obtained by the method for producing a copolymer according to the present disclosure may be used as positive resist as it stands, or after being subjected to purification for adjusting the weight-average molecular weight and the molecular weight distribution of the copolymer.

Copolymer

Here, the copolymer produced by the method for producing a copolymer according to the present disclosure contains, as a monomer unit (a repeating unit), the α-alkylstyrene unit and the α-chloroacrylate unit and, optionally, other monomer units.

Although the copolymer may also contain other monomer units, in a total content (100 mol %) of the monomer unit of the copolymer, the α-alkylstyrene unit and the α-chloroacrylate unit together account for preferably at least 90 mol %, and more preferably 100 mol % (i.e., the copolymer contains only the α-alkylstyrene unit and the α-chloroacrylate unit). A copolymer having a high total content of the α-alkylstyrene unit and the α-chloroacrylate unit, especially a copolymer containing only the α-alkylstyrene unit and the α-chloroacrylate unit as the monomer unit, may be favorably used as positive resist. Also, a copolymer having a high total content of the α-alkylstyrene unit and the α-chloroacrylate unit, especially a copolymer containing only the α-alkylstyrene unit and the α-chloroacrylate unit as the monomer unit, is particularly likely to improve the monomer conversion rate when ketone is used as the polymerization solvent for solution polymerization.

[α-Alkylstyrene Unit]

The α-alkylstyrene unit contained in the copolymer is a structural unit derived from α-alkylstyrene. Since the copolymer contains 30 mol % to 70 mol % of the α-alkylstyrene unit, the copolymer may demonstrate excellent dry etching resistance by virtue of a stable protection property of a benzene ring when used as positive resist.

Note that the copolymer preferably contains 40 mol % to 60 mol % of the α-alkylstyrene unit.

The α-alkylstyrene unit which may constitute the copolymer may be any α-alkylstyrene unit in which a linear alkyl group with four or less carbon atoms is bonded to α-carbon, such as an α-methylstyrene unit, an α-ethylstyrene unit, an α-propylstyrene unit, or an α-butylstyrene unit. Among them, from the viewpoint of enhancing the dry etching resistance when the copolymer is used as positive resist, the α-methylstyrene unit is preferably used as the α-alkylstyrene unit.

Here, the copolymer may include one or more units described above as the α-alkylstyrene unit.

[α-Chloroacrylate Unit]

The α-chloroacrylate unit contained in the copolymer is a structural unit derived from α-chloroacrylate. Since the copolymer contains 30 mol % to 70 mol % of the α-chloroacrylate unit, the main chain is readily cut by desorption of chlorine atoms and a β-cleavage reaction at irradiation of ionizing radiation and the like. Thus, the copolymer may be favorably used as positive resist having excellent sensitivity.

Note that the copolymer preferably contains 40 mol % to 60 mol % of the α-chloroacrylate unit.

The α-chloroacrylate unit which may constitute the copolymer is not particularly limited and may be, for example, an α-chloroacrylic acid alkyl ester unit such as a methyl α-chloroacrylate unit or an α-chloroacrylate unit, or a fluorine-substituted alkyl ester unit of α-chloroacrylic acid such as an α-chloroacrylic acid 2,2,2-trifluoroethyl unit. Among them, from the viewpoint of enhancing the sensitivity when the copolymer is used as positive resist, the α-chloroacrylate unit is preferably the methyl α-chloroacrylate unit.

Here, the copolymer may include one or more different units described above as α-chloroacrylate unit.

[Weight-Average Molecular Weight]

The weight-average molecular weight of the copolymer produced by the method for producing a copolymer according to the present disclosure is preferably at least 30000, more preferably at least 50000 and, also, preferably 100000 or less, more preferably 70000 or less. When the weight-average molecular weight of the copolymer is within the above range, the copolymer may be favorably used as positive resist. Also, when the copolymer having the weight-average molecular weight within the above range is produced by the solution polymerization by using ketone as the polymerization solvent, the monomer conversion rate is particularly likely to improve.

Further, the molecular weight distribution (weight-average molecular weight/number-average molecular weight) of the copolymer is preferably at least 1.3, more preferably at least 1.5 and, also, preferably 2.5 or less, more preferably 2.0 or less. The copolymer having the molecular weight distribution within the above range can be favorably used as positive resist. Also, when the copolymer having the molecular weight distribution within the above range is produced by the solution polymerization by using ketone as the polymerization solvent, the monomer conversion rate is particularly likely to improve.

Polymerization Process

In the polymerization process of the method for manufacturing a copolymer according to the present disclosure, the monomer composition containing α-alkylstyrene and α-chloroacrylate is subjected to the solution polymerization to yield a polymerization solution containing the copolymer. In the polymerization process, in particular, the monomer composition is subjected to the solution polymerization of a predetermined polymerization solvent by using the polymerization initiator, so as to obtain the polymerization solution containing the copolymer, the polymerization solvent, and unreacted materials such as residual monomers.

Note that the copolymer contained in the polymerization solution obtained by the polymerization process may be optionally recovered in a solid state by the recovery process described below.

[Monomer Composition]

The monomer composition subjected to the solution polymerization in the polymerization process contains α-alkylstyrene and α-chloroacrylate, and may optionally contain other monomers as well.

Here, α-alkylstyrene is a monomer for forming the α-alkylstyrene unit. α-Alkylstyrene may be any α-alkylstyrene in which a linear alkyl group with four or less carbon atoms is bonded to α-carbon, such as α-methylstyrene, α-ethylstyrene, α-propylstyrene, or α-butylstyrene. Among them, from the viewpoint of enhancing the dry etching resistance when the copolymer is used as positive resist, α-methylstyrene is preferably used as α-alkylstyrene.

Note that one or more types of α-alkylstyrene described above may be used.

Also, α-chloroacrylate is a monomer for forming the α-chloroacrylate unit. α-Chloroacrylate is not particularly limited and may be, for example, α-chloroacrylic acid alkyl ester such as methyl α-chloroacrylate and α-chloroacrylate, or fluorine-substituted alkyl ester of α-chloroacrylic acid such as α-chloroacrylic acid 2,2,2-trifluoroethyl. Among them, from the viewpoint of enhancing the sensitivity when the copolymer is used as positive resist, methyl α-chloroacrylate is preferably used as α-chloroacrylate.

Note that one or more types of α-chloroacrylate described above may be used.

Ratios of the monomers contained in the monomer composition may be adjusted to obtain a copolymer containing monomer units at desired ratios.

[Polymerization Solvent]

Here, in the method for producing a copolymer according to the present disclosure, when the monomer composition is subjected to the solution polymerization in the polymerization process, ketone is used as the polymerization solvent. When the ketone is used as the polymerization solvent in preparing a predetermined copolymer by performing solution polymerization of the monomer composition described above, the monomer conversion rate is higher than that of polymerization using dioxane as the polymerization solvent, and thus the copolymer may be more efficiently produced.

Ketone is not particularly limited and may be, for example, 2-pentanone, 3-pentanone, methyl isobutyl ketone, 2-heptanone, cyclopentanone, 2-methylcyclopentanone, 3-methylcyclopentanone, cyclohexanone, 2-methylcyclohexanone, 3-methylcyclohexanone, 4-methylcyclohexanone, or cycloheptanone. Among them, from the viewpoint of producing the copolymer more efficiently by further improving the monomer conversion rate, preferably cyclic ketone such as cyclopentanone, 2-methylcyclopentanone, 3-methylcyclopentanone, cyclohexanone, 2-methylcyclohexanone, 3-methylcyclohexanone, 4-methylcyclohexanone, or cycloheptanone, more preferably cyclopentanone or cyclohexanone is used as the polymerization solvent. Here, cyclopentanone and cyclohexanone have relatively low toxicity to the human body and thus are excellent in terms of safety. Hence, cyclopentanone and cyclohexanone are particularly favorable as the polymerization solvent.

As the polymerization solvent, one or more types of ketone described above may be used.

[Polymerization Initiator]

The polymerization initiator may be, for example, organic peroxide such as di-tert-butyl peroxide (t-BuOOBu-t) or tert-butyl hydroperoxide (t-BuOOH), or azo compound such as 1,1'-azobis (cyclohexanecarbonitrile) or azobisisobutyronitrile. Among them, an azo-compound radical polymerization initiator is preferably used as the polymerization initiator. From the viewpoint of further improving the monomer conversion rate and efficiently producing the copolymer, azobisisobutyronitrile is preferably used.

[Polymerization]

For the solution polymerization performed by mixing the monomer compound, the polymerization solvent, and the polymerization initiator described above, temperature is not particularly limited and may be, for example, 40° C. to 120° C., preferably 50° C. to 100° C. When the temperature is equal to or higher than the lower limit described above, the polymerization initiator functions adequately. Also, when the temperature is equal to or lower than the upper limit described above, acceleration of decomposition of the polymerization initiator is suppressed, and polymerization reaction may be maintained under control.

Duration for the solution polymerization is not particularly limited and may be, for example, 1 to 96 hours, preferably 2 to 72 hours. When a reaction time is equal to or more than the lower limit described above, polymerization reaction may be maintained under control. Also, when the reaction time is equal to or less than the upper limit described above, the copolymer may be produced in less time and thus economically.

The solution polymerization is not particularly limited and may be carried out in an inert gas atmosphere such as a nitrogen atmosphere.

An amount of the polymerization solvent used for 100 parts by mass of the monomer composition may be, for example, 10 to 1000 parts by mass, preferably 50 to 500 parts by mass. When the amount of the polymerization solvent is equal to or more than the lower limit, the polymerization reaction is prevented from becoming out of control due to a viscosity change in the course of the polymerization reaction. When the amount of the polymerization solvent is equal to or less than the upper limit, a cost increase entailed in extraction of the copolymer from the polymerization solution may be prevented.

The amount of the polymerization initiator used for 100 parts by mass of the monomer composition may be, for example, 0.01 to 5 parts by mass, preferably 0.02 to 1 part by mass. When the amount of the polymerization initiator is equal to or more than the lower limit described above, discontinuation of the polymerization reaction due to deactivation may be prevented. Also, when the amount of the polymerization initiator is equal to or less than the upper limit described above, the polymerization reaction is prevented from rapidly progressing and may be maintained under control.

Recovery Process

The copolymer contained in the polymerization solution obtained by the solution polymerization of the monomer composition described above may be recovered in any appropriate manner including, for example, by solidifying the copolymer by instillation of the polymerization solution into a poor solvent such as methanol or the like and then separating a solidified copolymer by using a solid-liquid separation means such as filtration (removing the polymerization solvent and unreacted materials such as residual monomers from the polymerization solution). Here, for satisfactory removal of the polymerization solvent and the unreacted materials, the copolymer solidified and separated in the above manner may be recovered in the recovery process by being re-melted in a good solvent such as tetrahydrofuran, followed by being instilled into the poor solvent such as methanol for re-solidification of the copolymer.

The method for recovering the copolymer from the polymerization solution in the recovery process is not limited to the manner described above. In the recovery process, the copolymer may be recovered by employing known methods including distillation of the polymerization solvent and unreacted materials.

Purification Process

A purification process is optionally performed on the copolymer produced by the method for producing a copolymer according to the present disclosure, in order to obtain a purified copolymer (a purified product) having weight-average molecular weight and a molecular weight distribution within the respective desired ranges by purifying the copolymer obtained by the recovery process. Here, a method for purifying the copolymer is not particularly limited, and a known purification method such as re-deposition or column chromatography may be employed. Among them, re-deposition is preferable as the method for purifying the copolymer.

Note that the purification process of the copolymer may be repeatedly performed a plurality of times.

Preferably, in the purification process of the copolymer by employing re-deposition, for example, the resulting copolymer is resolved in the good solvent such as tetrahydrofuran, and a resulting solution is instilled into a mixed solvent of the good solvent such as tetrahydrofuran and the poor solvent such as methanol, to cause partial deposition of the copolymer. When the copolymer is purified by instilling the solution of the copolymer into the mixed solvent of the good solvent and the poor solvent as described above, the molecular weight distribution and the weight-average molecular weight of the purified copolymer may be readily adjusted by changing types of, or mixing ratios of, the good solvent and the poor solvent. In particular, for example, the molecular weight of the copolymer deposited in the mixed solvent increases as a ratio of the good solvent in the mixed solvent increases.

In the purification process of the copolymer employing re-deposition, a copolymer deposited in the mixed solvent of the good solvent and the poor solvent may be recovered as a purified copolymer, or a copolymer that is not deposited in the mixed solvent (i.e., a copolymer dissolved in a mixed solvent) may be recovered as the purified copolymer. Here, the copolymer that is not deposited in the mixed solvent may be recovered from the mixed solvent by using known techniques including concentration to dryness.

Production of Positive Resist Composition

The copolymer produced by the method described above and the purified copolymer obtained by purifying the copolymer may be used to produce a positive resist composition, without any particular restriction. The positive resist composition may be prepared by, for example, mixing the copolymer produced by the method described above or the purified copolymer obtained by purifying the copolymer with a solvent, and optionally adding a known additive that can be compounded in the resist composition.

Here, the solvent may be any known solvent that can dissolve the copolymer or the purified copolymer described above. Examples of the solvent include: ketone such as methyl isobutyl ketone, cyclohexanone, and cyclopentanone; glycol ether such as ethylene glycol dimethyl ether, ethylene glycol diethyl ether, and dioxane; alcohol ether such as ethylene glycol monomethyl ether, ethylene glycol monoethyl ether, propylene glycol monomethyl ether, and propylene glycol monoethyl ether; oxycarboxylic acid ester such as methyl 2-oxypropionate, ethyl 2-oxypropionate, methyl 2-methoxypropionate, and ethyl 2-methoxypropionate; cellosolve ester such as cellosolve acetate, methyl cellosolve acetate, ethyl cellosolve acetate, propyl cellosolve acetate, and butyl cellosolve acetate; propylene glycol such as propylene glycol, propylene glycol monomethyl ether acetate, propylene glycol monoethyl ether acetate, and propylene glycol monobuthyl ether; diethylene glycol such as diethylene glycol monomethyl ether, diethylene glycol monoethyl ether, diethylene glycol dimethyl ether, and diethylene glycol diethyl ether; halogenated hydrocarbon such as dichloromethane and trichlorethylene; aromatic compound such as toluene, xylene, anisole, o-dichlorobenzene, and ethyl benzoate; and a polar solvent such as N,N-dimethylformamide, N,N-dimethylacetamide, and N-methylacetamide, N-methylpyrrolidone. Among them, diethylene glycol and the aromatic compound are preferable, and diethylene glycol dimethyl ether, anisole, cyclopentanone, cyclohexanone, and o-dichlorobenzene are more preferable as the solvent for their excellent solubility of the copolymer described above. These solvents may be used alone or in combination of two or more of them.

EXAMPLES

Hereinafter, the present disclosure will be described in detail on the basis of examples. However, the present disclosure is not limited thereto. In the following description, "%" and "parts" representing a quantity are in terms of by mass, unless otherwise specified.

In examples and comparative examples, the monomer conversion rate, a recovery rate, the weight-average molecular weight, the number-average molecular weight, and the molecular weight distribution of the copolymer were measured by the following methods.

[Conversion Rate]

Approximately 0.6 g of polymerization solution was dispensed to an aluminum plate. Then, the aluminum plate having the polymerization solution thereon was placed in a thermostatic oven and heated in a nitrogen atmosphere at a temperature of 160° C. for 20 minutes to remove a polymerization solvent and residual monomers. Subsequently, the weight of the polymer remained on the aluminum plate was measured. Then, the conversion rate was calculated by using the equation set forth below. Note that "a theoretical value of an amount of the monomer used to prepare the polymer solution weighed and dispensed to aluminum plate" in the equation may be obtained by dividing a total weight of the monomer used for the polymerization by the weight of the polymerization solution, and then multiplying a resulting value by the amount of the polymerization solution weighed and dispensed to the aluminum plate.

Conversion rate=(Weight of polymer remained on aluminum plate)÷(Theoretical value of amount of monomer used to prepare polymer solution weighed and dispensed to aluminum plate)×100 (%)

[Recovery Rate]

The weight of the resulting copolymer was measured. Then, the recovery rate was calculated by using the following equation:

(Weight of copolymer)÷(Total weight of monomer used for polymerization)×100(%)

[Weight-average molecular weight, number-average molecular weight, and molecular weight distribution]

A weight-average molecular weight (Mw) and a number-average molecular weight (Mn) of the resulting copolymer were measured by employing gel permeation chromatography, and thus a molecular weight distribution (Mw/Mn) was calculated.

In particular, the weight-average molecular weight (Mw) and the number-average molecular weight (Mn) of the copolymer were obtained as values in terms of standard polystyrene, by using gel permeation chromatograph (HLC-8220 manufactured by Tosoh Corporation) and tetrahydrofuran as a developing solvent. Then, the molecular weight distribution (Mw/Mn) was calculated.

Example 1

Into a glass container, 90.0 g of methyl α-chloroacrylate and 200.0 g of α-methylstyrene as the monomer composition, 300.0 g of cyclopentanone as the polymerization solvent, and 0.335 g of azobisisobutyronitrile as the polymerization initiator were introduced. The glass container was sealed and purged with nitrogen, and then a resulting mixture was stirred in a thermostatic vessel kept at a temperature of 78° C. for 48 hours. In this way, the solution polymerization of the monomer composition was performed. At this point, the conversion rate was 44.5% by mass. Subsequently, the glass container was brought back to the room temperature with its contents exposed to the atmosphere, and the resulting contents was instilled into 1500 g of methanol taking as long as 20 minutes, for deposition of precipitation. Then, the solution containing the deposited precipitation was filtered by suction funnel using a filter paper (No. 2 manufactured by ADVANTEC Co., Ltd.) and dried in well-ventilated place for 48 hours, to yield a white coagulum.

Subsequently, the white coagulum was dissolved in 300 g of tetrahydrofuran (THF), and the resulting solution was instilled into 1500 g of methanol taking as long as 20 minutes. A white precipitation thus obtained was filtered by suction funnel using a filter paper (No. 2 manufactured by ADVANTEC Co., Ltd.) and dried in well-ventilated place for 48 hours, to yield a white coagulum (copolymer). The resulting copolymer weighed 116.6 g (i.e., the recovery rate was 40.2% by mass).

Then, the weight-average molecular weight, the number-average molecular weight, and the molecular weight distribution of the resulting copolymer were measured. The results are illustrated in Table 1. The resulting copolymer contained, as the monomer unit (the repeating unit), 50 mol % of the α-methylstyrene unit and 50 mol % of the methyl α-chloroacrylate unit.

Example 2

A copolymer was prepared in the same manner as the example 1, except for using 300 g of cyclohexanone as the polymerization solvent. Then, the copolymer was subjected to various measurements in the same manner as the example 1. The results are illustrated in Table 1.

The resulting copolymer contained, as the monomer units (the repeating units), 49 mol % of the α-methylstyrene unit and 53 mol % of the methyl α-chloroacrylate unit.

Comparative Example 1

A copolymer was prepared in the same manner as the example 1, except for using 300 g of dioxane as the polymerization solvent and setting the polymerization temperature to 80° C. Then, the copolymer was subjected to various measurements in the same manner as the example 1. The results are illustrated in Table 1.

The resulting copolymer contained, as the monomer unit (the repeating unit), 47 mol % of the α-methylstyrene unit and 51 mol % of the methyl α-chloroacrylate unit.

Comparative Example 2

Preparation of the copolymer was attempted in the same manner as the example 1, except for using 300 g of methyl cellosolve acetate as the polymerization solvent and setting the polymerization temperature to 80° C. However, the reaction was stopped due to deposition of the copolymer in the course of the reaction (8 hours after start of the polymerization).

TABLE 1

|  |  | Example 1 | Example 2 | Comparative Example 1 | Comparative Example 2 |
|---|---|---|---|---|---|
| Polymerization Condition | Polymerization Solvent | cyclopentanone | cyclohexanone | dioxane | methyl cellosolve acetate |
|  | Polymerization Temperature [C. °] | 78 | 78 | 80 | 80 |
|  | Polymerization Duration [hrs] | 48 | 48 | 48 | cancel due to deposition |
| Copolymer | Weight-Average Molecular Weight [—] | 61300 | 59200 | 57500 | — |
|  | Molecular Weight Distribution [—] | 1.84 | 1.81 | 1.82 | — |
|  | Conversion Rate [mass %] | 44.5 | 42.6 | 32.2 | — |
|  | Recovery Rate [mass %] | 40.2 | 38.8 | 28.5 | — |

It can be seen from Table 1 that the examples 1 and 2 using ketone as the polymerization solvent have higher conversion rates and recovery rates than the comparative example 1 using dioxane as the polymerization solvent. In particular, regardless of the polymerization temperatures lower than that of the comparative example 1 using dioxane as the polymerization solvent, the examples 1 and 2 have conversion rates and recovery rates higher than those of the comparative example 1, thus demonstrating highly effective production of the α-alkylstyrene α-chloroacrylate copolymer.

It can also be seen from Table 1 that in the comparative example 2 using methyl cellosolve acetate, the solution polymerization could not be performed due to deposition of the copolymer.

INDUSTRIAL APPLICABILITY

The method for producing a copolymer according to the present disclosure is capable of improving the monomer conversion rate and efficiently producing an α-alkylstyrene α-chloroacrylate copolymer.

The invention claimed is:

1. A method for producing a copolymer containing 30 mol % to 70 mol % of an α-alkylstyrene unit and 30 mol % to 70 mol % of an α-chloroacrylate unit, the method for producing a copolymer includes:
    a step of performing solution polymerization of a monomer composition containing α-alkylstyrene and α-chloroacrylate,
    wherein ketone is used as a polymerization solvent for the solution polymerization.

2. The method for producing a copolymer according to claim 1,
    wherein cycloketone is used as the polymerization solvent.

3. The method for producing a copolymer according to claim 1,
    wherein cyclopentanone or cyclohexanone is used as the polymerization solvent.

4. The method for producing a copolymer according to claim 1,
    wherein α-methylstyrene is used as α-alkylstyrene, and methyl α-chloroacrylate is used as α-chloroacrylate.

5. The method for producing a copolymer according to claim 1,
    wherein a total content of the α-alkylstyrene unit and the α-chloroacrylate unit in the copolymer accounts for 100 mol %.

6. The method for producing a copolymer according to claim 1,
    wherein a weight-average molecular weight of the copolymer is 30000 to 100000.

7. The method for producing a copolymer according to claim 1,
    wherein a weight-average molecular weight of the copolymer is 50000 to 70000.

8. The method for producing a copolymer according to claim 1,
    wherein a molecular weight distribution of the copolymer obtained by dividing weight-average molecular weight by number-average molecular weight is 1.3 to 2.5.

9. The method for producing a copolymer according to claim 1,
    wherein the solution polymerization is performed by using azobisisobutyronitrile as a polymerization initiator.

* * * * *